US012199681B2

United States Patent
Hjartarson et al.

(10) Patent No.: US 12,199,681 B2
(45) Date of Patent: Jan. 14, 2025

(54) ELECTRO-PHOTONIC TRANSMITTER AND RECEIVER INTEGRATED CIRCUITS (CHIPLETS) FOR CO-PACKAGED OPTICS AND METHODS OF OPERATION

(71) Applicant: ElectroPhotonic-IC Inc., Kanata (CA)

(72) Inventors: Gudmundur A. Hjartarson, Ottawa (CA); Lawrence E. Tarof, Kanata (CA); Richard D. Clayton, Ottawa (CA); Vighen Pacradouni, Montreal (CA)

(73) Assignee: ElectroPhotonic-IC Inc., Kanata (CA)

( * ) Notice: Subject to any disclaimer, the term of this patent is extended or adjusted under 35 U.S.C. 154(b) by 0 days.

(21) Appl. No.: 18/743,462

(22) Filed: Jun. 14, 2024

(65) Prior Publication Data

US 2024/0421909 A1 Dec. 19, 2024

Related U.S. Application Data

(60) Provisional application No. 63/521,411, filed on Jun. 16, 2023.

(51) Int. Cl.
*H04B 10/43* (2013.01)
*H04B 10/40* (2013.01)
*H01S 5/026* (2006.01)

(52) U.S. Cl.
CPC .......... *H04B 10/40* (2013.01); *H04B 10/43* (2013.01); *H01S 5/026* (2013.01)

(58) Field of Classification Search
CPC .......... H04B 10/40; H04B 10/43; H01S 5/26
See application file for complete search history.

(56) References Cited

U.S. PATENT DOCUMENTS

| | | | |
|---|---|---|---|
| 7,444,055 B2 | 10/2008 | Tolstikhin et al. | |
| 10,461,504 B2 | 10/2019 | Watson et al. | |
| (Continued) | | | |

FOREIGN PATENT DOCUMENTS

| | | |
|---|---|---|
| WO | 2021068059 A1 | 4/2021 |
| WO | 2021097560 | 5/2021 |
| (Continued) | | |

OTHER PUBLICATIONS

R. B. Welstand, S. A. Pappert, C. K. Sun, J. T. Zhu, Y. Z. Liu and P. K. L. Yu, "Dual-function electroabsorption waveguide modulator/detector for optoelectronic transceiver applications," in IEEE Photonics Technology Letters, vol. 8, No. 11, pp. 1540-1542, Nov. 1996, doi: 10.1109/68.541576. (Year: 1996).*

(Continued)

*Primary Examiner* — Nathan M Cors
(74) *Attorney, Agent, or Firm* — Miltons IP/p.i.

(57) ABSTRACT

Electro-photonic integrated circuits comprising optical transmitters and receivers are disclosed, wherein a monolithically integrated electro-absorption modulated laser (EML) is operable bidirectionally, in a transmitter mode and in a receiver mode. Vertically stacked waveguides are provided for a laser and an electro-absorption modulator (EAM). The laser and EAM are optically coupled using a laterally tapered vertical optical coupler. The EML comprises monolithically integrated electronic circuitry, e.g., driver and control electronics for the driving the laser and EAM as an EML, in transmitter mode. The electronic circuitry comprises a transimpedance amplifier (TIA). The EAM has first and second parts that can be independently biased. In receiver mode, the laser current is reduced to close to the threshold, and a first part of the EAM is biased to absorb residual laser light, and the second part of the EAM (Continued)

acts as a photodiode receiver to provide a photocurrent to the TIA.

23 Claims, 11 Drawing Sheets

(56) References Cited

U.S. PATENT DOCUMENTS

| | | | |
|---|---|---|---|
| 10,530,484 B2 | 1/2020 | Hjartarson et al. | |
| 10,673,532 B2 | 6/2020 | Hjartarson et al. | |
| 10,693,278 B2 | 6/2020 | Watson et al. | |
| 11,092,762 B2 | 8/2021 | Hjartarson et al. | |
| 2003/0016418 A1* | 1/2003 | Westbrook | H04B 10/29 398/115 |
| 2005/0006654 A1* | 1/2005 | Kang | H01S 5/026 372/50.1 |
| 2012/0269215 A1* | 10/2012 | Lv | H04B 10/505 372/28 |
| 2019/0072672 A1* | 3/2019 | Yao | G01S 7/4814 |
| 2022/0190550 A1* | 6/2022 | Hjartarson | H01S 5/0265 |
| 2022/0311206 A1 | 9/2022 | Clayton et al. | |
| 2023/0019783 A1 | 1/2023 | Tarof et al. | |

FOREIGN PATENT DOCUMENTS

| | | |
|---|---|---|
| WO | 2021097560 A1 | 5/2021 |
| WO | 2021119803 A1 | 6/2021 |

OTHER PUBLICATIONS

International Search Report issued on corresponding International Patent Application No. PCT/CA2024/050804, mailed Sep. 5, 2024; 4 pages.

Cheng, H-L, et al.; "Optical single-sideband OFDM transmission based on a two-segment EAM"; Optics Express, Jan. 15, 2015; vol. 23, Issue 2, pp. 982-990.

Schrenk, B.; "Electroabsorption-modulated laser as optical transmitter and receiver: status and opportunities"; IET Optoelectronics; Oct. 6, 2020; vol. 14, Issue 6, pp. 374-385.

Minkenberg, C. et al.; "Co-packaged datacenter optics: Opportunities and Challenges"; IET Optoelectronics; 2021; 15: pp. 77-91.

* cited by examiner

100

200

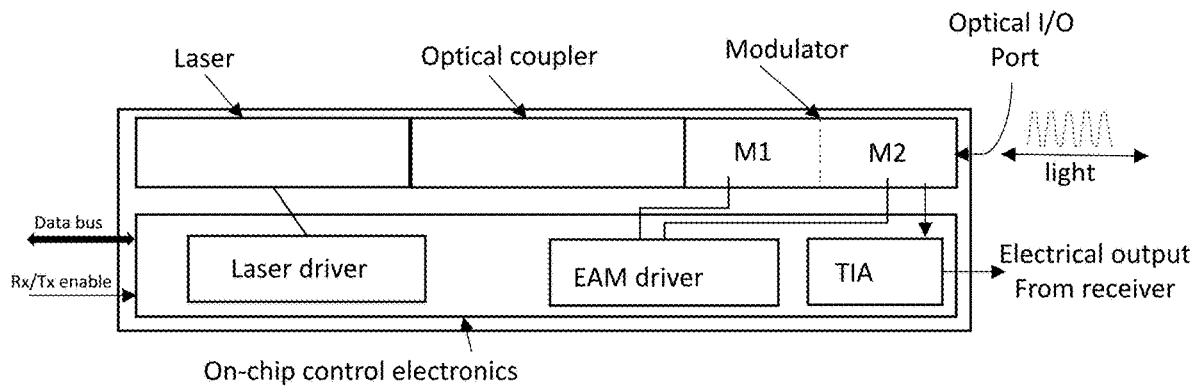

Fig. 3

Bi-directional operation of electro-photonic module in Transmitter Mode and Receiver Mode

Transmitter Mode

Laser ON to provide CW output, which is optically coupled to Modulator

EAM driver drives both parts M1 and M2 of Modulator to provide modulated optical output

Receiver Mode

Laser nearly OFF- laser driver reduces laser drive current close to threshold current to reduce light output EAM driver drives first part of Modulator M1 to absorb residual laser light and operates the second part M2 as a photo-diode receiver to receive optical input and provide photocurrent output to TIA

Fig. 4

Electro-photonic module for bi-directional operation of EML as Tx and Rx

Each module functions bi-directionally to allow for bi-directional optical data buses 128 Ports – 29 Tb/s
Total power – 14 W
(0.5 pJ/bit)

Total I/O area – 38 mm$^2$

800

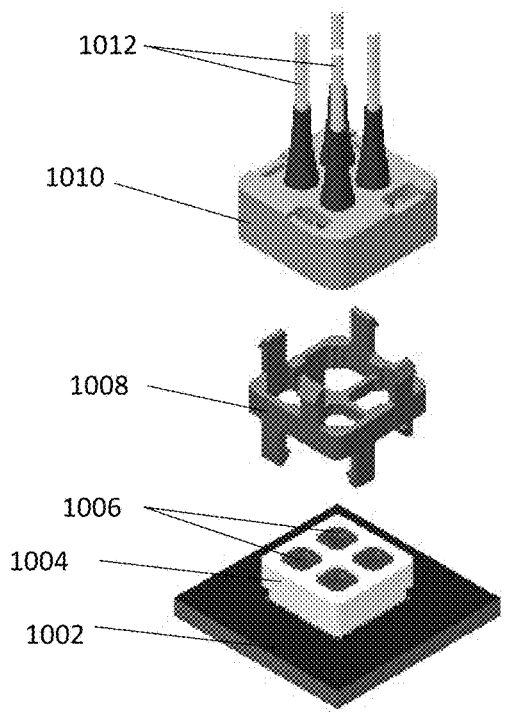
Fig. 12
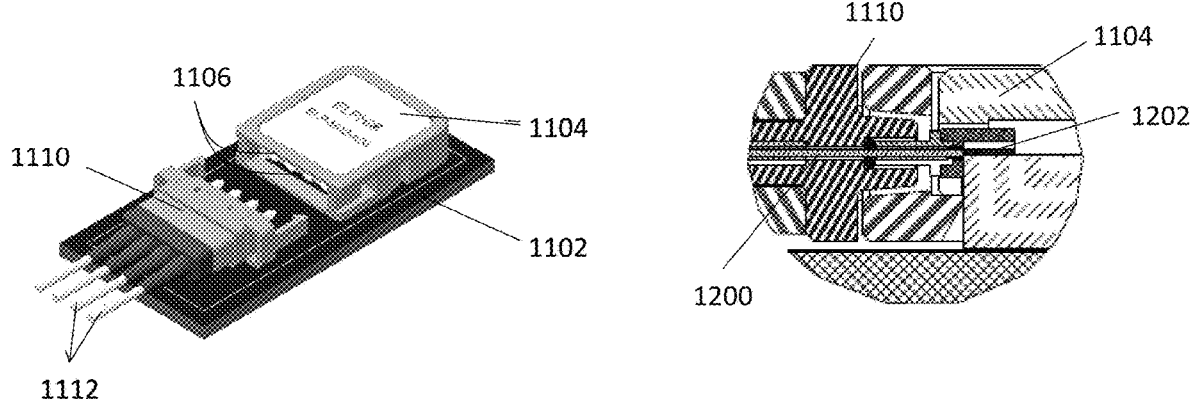
Fig. 13
Fig. 14

ELECTRO-PHOTONIC TRANSMITTER AND RECEIVER INTEGRATED CIRCUITS (CHIPLETS) FOR CO-PACKAGED OPTICS AND METHODS OF OPERATION

CROSS-REFERENCE TO RELATED APPLICATION(S)

This application claims priority from U.S. provisional patent application No. 63/521,411, filed Jun. 16, 2023, entitled "Indium Phosphide-Based Electro-Photonic Transmitter and Receiver Integrated Circuits (Chiplets) for Co-Packaged Optics and Methods of Operation", which is incorporated herein by reference in its entirety.

This application is related to U.S. patent application Ser. No. 17/687,803, filed Mar. 7, 2022, entitled "Vertically Integrated Electro-Absorption Modulated Laser and Methods of Fabrication", which is a continuation-in-part of application no. PCT/CA2020/051562, filed Nov. 17, 2020, which claims priority from U.S. provisional patent application No. 62/936,629 filed Nov. 18, 2019, all of which are incorporated herein by reference in their entirety.

This application is related to U.S. patent application Ser. No. 17/785,989, filed Jun. 16, 2022, entitled "Optical Receiver comprising monolithically integrated photodiode and transimpedance amplifier", which is a National Stage entry of PCT/CA2020/051666, filed Dec. 4, 2020, which claims priority from U.S. provisional patent application No. 62/950,479 filed Dec. 19, 2019, all of which are incorporated herein by reference in their entirety.

TECHNICAL FIELD

This invention relates to integrated electro-photonic receiver and transmitter modules, and more particularly relates to Indium Phosphide (InP)-based electro-photonic receiver and transmitter modules, and co-packaging of InP-based electro-photonic modules with silicon electronics.

BACKGROUND

For background information, reference is made to a review article entitled "Co-packaged datacenter optics: Opportunities and Challenges", IET Optoelectronics, 2021; 15: pp. 77-91. For example, FIG. 6 of this reference shows an example roadmap for CPO (Co-Packaged Optics) to illustrate increasing levels of integration of optical modules and switch ASICs (Application Specific Integrated Circuits), using a representation that focuses on linear distance between optical modules and ASICs. Some example distances for Long reach (LR), Medium Reach (MR), Very Short Reach (VSR), Extra Short Reach (XSR), and Ultra Short Reach (USR) are shown in Table 3 of this reference.

Other important considerations are cost per capacity ($/Gb/s), energy efficiency (pJ/bit), and reduced port-to-port spacing for high density fiber arrays.

For example, there is a need for improved or alternative InP-based electro-photonic receiver and transmitter modules, and solutions for co-packaging of InP-based electro-photonic modules with silicon electronics.

SUMMARY OF INVENTION

The present invention seeks to provide improved or alternative electro-photonic integrated circuits comprising receivers and transmitters, and solutions for co-packaging of electro-photonic modules with other electronics, e.g. silicon integrated circuits, which overcome or mitigate one or more of the above-mentioned issues.

Aspects of the invention provide an electro-photonic integrated circuit capable of bidirectional operation of an electro-absorption modulated laser (EML) as a transmitter and a receiver, methods of operation of the EML as a transmitter and a receiver, and solutions for co-packaging of electro-photonic modules with silicon electronics, such as core processors and other switch ASICs.

One aspect provides an electro-photonic integrated circuit comprising an electro-absorption modulated laser (EML),
  the EML comprising a laser and an electro-absorption modulator (EAM), and control circuitry comprising a laser driver circuit, an EAM driver circuit, and a transimpedance amplifier,
  wherein the EAM comprises a first part and a second part comprising electrical connections to the first part and the second part of the EAM, and wherein the control circuitry is configured to bias said electrical connections to operate the first and second parts of the EAM independently in a transmitter mode and in a receiver mode:
  in the transmitter mode, the laser and first and second parts of the EAM are operable as an EML to provide a modulated optical output; and
  in the receiver mode, the second part of the EAM is operable as a photodiode receiver to receive an optical input and output a photocurrent to the TIA.

In the transmitter mode, the laser is turned on using the laser driver circuit to provide an appropriate laser drive current, and the EAM driver circuit operates the EAM to provide the modulated optical output; and in the receiver mode, the laser drive current is reduced to close to the threshold current, the first part of the EAM is biased to absorb remaining light from the laser, and the second part of the EAM acts as a photodiode receiver for optical input which is detected by the TIA circuit An electro-photonic integrated circuit comprising an electro-absorption modulated laser (EML) capable of bidirectional operation in a transmitter mode and a receiver mode, with monolithically integrated control electronics, may be fabricated using a InP based semiconductor material system. Beneficially, a structure using vertical optical coupling of the laser waveguide and EAM waveguide using laterally tapered vertical optical couplers provides for a compact design with small form factor. In alternative embodiments, the laser and EAM may be laterally optically coupled.

For example, an electro-photonic integrated circuit is provided comprising: a semi-insulating (SI) substrate; an epitaxial layer structure comprising a plurality of semiconductor layers grown on the SI substrate; the epitaxial layer structure defining: a first plurality of semiconductor layers comprising control circuitry; and a second plurality of semiconductor layers providing a plurality of vertically stacked optical waveguides, wherein: a first waveguide comprises layers structured as an electro-absorption modulator (EAM) waveguide; a second waveguide comprises layers structured as a laser waveguide; said layers of the second waveguide are patterned to define a laser mesa providing a laser cavity and a laterally tapered vertical optical coupler extending from an optical output of the laser cavity; said layers of the first waveguide are patterned to define a mesa of the EAM; wherein the laser cavity is laterally spaced from the EAM along the direction of optical propagation, and the laterally tapered vertical optical coupler is structured to couple an emitted optical mode from the laser to an input of the EAM; and the control circuitry comprises a laser driver circuit, an EAM driver circuit, and a transimpedance amplifier (TIA); first electrical connections between the laser driver circuit and the laser for operating the laser in CW mode; second electrical connections between the EAM driver circuit and the EAM for driving the EAM, wherein the EAM comprises a first part (e.g. half) and a second part (e.g. half) which can be separately (independently) biased; the control circuitry providing for bidirectional operation wherein: in a transmitter mode, the laser and EAM are operable as an EML to provide a modulated optical output; and in a receiver mode, the second part of the EAM acts as a photodiode receiver to receive an optical input and output a photocurrent to the TIA.

In the transmitter mode, the laser is turned on using the laser driver circuit to provide an appropriate laser drive current, and the EAM driver circuit operates the EAM to provide the modulated optical output; and in the receiver mode, the laser drive current is reduced to close to the threshold current, the first part of the EAM is biased to absorb remaining light from the laser, and the second part of the EAM acts as a photodiode receiver for optical input which is detected by the TIA circuit.

For example, the SI substrate is Fe-doped InP and the EML is fabricated from an InP-based material system, comprising selected binary, ternary and quaternary and other compositions of In, Ga, As, P, Al, and Sb.

The control circuitry may comprise a switch for switching between the transmitter mode and the receiver mode, the switch having an input for receiving a transmit enable or receive enable signal from a data bus logic circuit.

In some embodiments, the electro-photonic integrated circuit comprises a plurality of EAMs, and the laser is optically coupled to the plurality of EAMs through a 1:N optical splitter. For example, the electro-photonic integrated circuit of an example embodiment comprises four EAMs, and the laser output is optically coupled to the four EAMs through a 1:4 optical splitter.

A passive waveguide may be vertically disposed under the EAM waveguide and patterned to form a spot size converter (SSC); and the EAM waveguide may comprise a second laterally tapered vertical optical coupler structured to couple the optical output/input from/to the SSC for optical coupling to a single mode optical fiber.

In example embodiments, the plurality of semiconductor layers for the control circuitry are vertically separated from the plurality of vertically stacked optical waveguides by at least one spacer layer; the optical components comprising the laser and the EAM are formed on a first area of the SI substrate; and the control circuitry is formed on a second area of the SI substrate, adjacent the first area.

The electro-photonic integrated circuit may be fabricated with III-V semiconductor materials, for example, an InP-based material system, comprising selected binary, ternary and quaternary and other compositions of In, Ga, As, P, Al, and Sb. In some embodiments, the epitaxial layer structure is compatible with a single epitaxial growth process.

Another aspect of the invention provides a surface mount electro-photonic module comprising: a substrate, a plurality of electro-photonic integrated circuits as disclosed herein, the plurality of electro-photonic integrated circuits being arranged around a peripheral area of the substrate to provide optical I/O along each edge of the substrate; and a plurality of electronic integrated circuits mounted within an inside area of the substrate.

For example, in some embodiments, the plurality of electronic integrated circuits are silicon integrated circuits, such as core processors or other ASICs.

The surface mount electro-photonic module may be configured for edge-coupling of optical fibers to optical ports of each electro-photonic integrated circuit. For example, the optical port-port spacing is in a range of 200 μm to 300 μm, and 128 ports are distributed around the periphery of the substrate.

InP-based electro-photonic integrated circuits (chiplets) of some example embodiments are disclosed, which are capable of bidirectional operation, in transmit and receive modes, and which are suitable for co-packaging with other integrated circuits, e.g. silicon chiplets, for example, to provide electro-photonic transceiver modules.

Another aspect of the invention provides a method of operation of an electro-photonic integrated circuit comprising an electro-absorption modulated laser (EML) as a transmitter and as a receiver, the EML comprising a laser and an electro-absorption modulator (EAM), and control circuitry comprising a laser driver, an EAM driver and a transimpedance amplifier (TIA), wherein the EAM comprises a first part (e.g. half) and a second part (e.g. half) which can be separately (independently) biased, the method comprising: in a transmitter mode, operating the laser and EAM as an EML to provide a modulated optical output; and in a receiver mode, operating the second part of the EAM a photodiode receiver to receive an optical input and output a photocurrent to the TIA.

For example, in the transmitter mode, the laser is turned on using the laser driver circuit to provide an appropriate laser drive current to provide a cw laser output, and the EAM driver circuit operates the first and second parts of the EAM to provide the modulated optical output; and in the receiver mode, the EML operates as a receiver, after reducing the laser drive current close to the threshold current, the first part of the EAM is biased to absorb remaining light from the laser, and the second half of the EAM acts as a photodiode receiver for optical input to generated a photocurrent that is detected by the TIA circuit.

Thus, electro-photonic integrated circuits comprising receivers and transmitters, and solutions for co-packaging of electro-photonic modules with other electronics, e.g. silicon integrated circuits are disclosed.

BRIEF DESCRIPTION OF THE DRAWINGS

FIG. 3 shows a schematic block diagram of an electro-photonic module comprising an EML of example embodiments configured for bidirectional operation in a transmitter mode and in a receiver mode;

FIG. 4 shows a diagram to illustrate bi-directional operation of the electro-photonic module of FIG. 3 in a transmitter mode and in a receiver mode;

FIG. 12 shows a schematic diagram of a surface mount optical module configured for vertical coupling of optical fibers;

FIG. 13 shows a schematic diagram of a surface mount optical module configured for lateral coupling of optical fibers;

FIG. 14 shows a schematic cross-sectional diagram of part of the optical module of FIG. 13, to illustrate lateral coupling of an optical fiber to the surface mount optical module.

The foregoing and other features, aspects and advantages will be more apparent from the following detailed description, taken in conjunction with the accompanying drawings, of example embodiments, which description is by way of example only.

DETAILED DESCRIPTION

The above referenced related U.S. patent application Ser. No. 17/687,803, filed Mar. 7, 2022, entitled "Vertically Integrated Electro-Absorption Modulated Laser and Methods of Fabrication", discloses monolithically integrated EML of some example embodiments which comprise a DFB laser and an EAM which are vertically integrated, fabricated using MGVI (Multi-Guide Vertical Integration), wherein the DFB laser and the EAM are vertically coupled by a laterally tapered vertical optical coupler.

Figure 1:
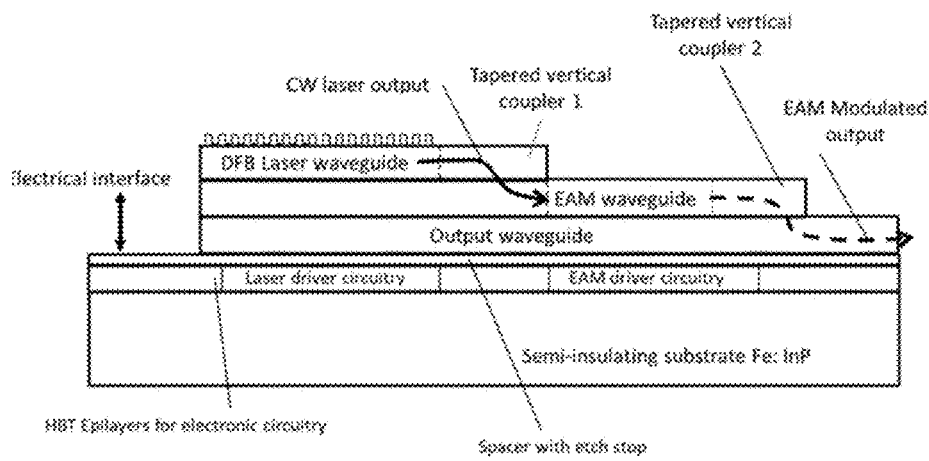
FIG. 1 shows a schematic cross-sectional diagram of an electro-photonic integrated circuit comprising an EML of an example embodiment comprising a DFB laser and an EAM with integrated electronic circuitry.
Figure 2:
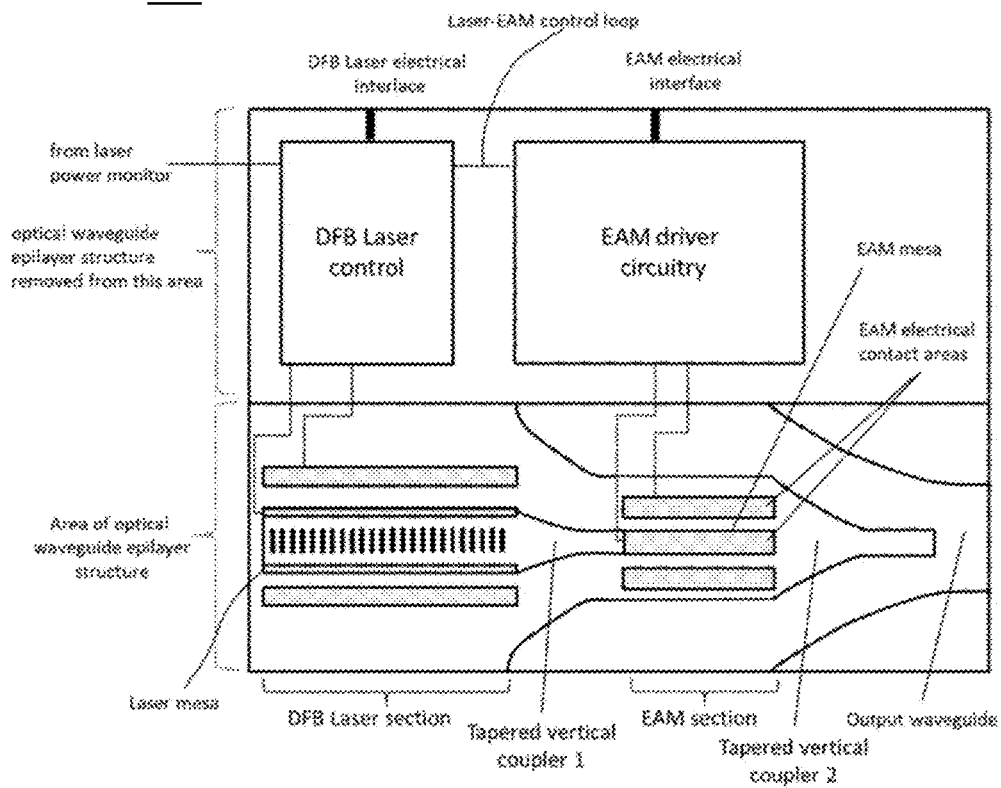
FIG. 2 shows a schematic top plan view of the electro-photonic integrated circuit comprising the EML of FIG. 1.

For example, FIG. 1 shows a schematic longitudinal cross-sectional view 100 of an electro-photonic module comprising a monolithically integrated EML. The EML comprises a DFB laser and EAM, fabricated using MGVI. This method of fabrication provides for vertical integration of active and passive components formed in multiple vertically stacked waveguides, and is compatible with single epitaxial growth of III-V semiconductor, e.g. using an InP-based material system. In this example, the structure comprises a semi-insulating (SI) substrate, e.g. Fe doped InP, on which an epitaxial layer stack (which may be referred to as an epi-layer stack or epi-stack or epilayers) is grown to define layers of: a first level waveguide, labelled output waveguide; a second level waveguide, labelled EAM waveguide; and a third level waveguide labelled DFB laser waveguide, on which is defined a surface-etched-grating (SEG). The waveguides are optically coupled vertically by vertical optical couplers formed by laterally tapered portions of the respective waveguides, as illustrated schematically in the schematic plan view 200 of the monolithically integrated EML of FIG. 1, which is shown in FIG. 2. The third level waveguide is processed to define a laser mesa and a first laterally tapered vertical optical coupler 1. The SEG is etched in a top surface of the DFB laser portion of the mesa to form the DFB laser and the laterally tapered vertical optical coupler extends from the optical output of the laser over a length of the second level waveguide for vertically optically coupling of the emitted mode from the laser to the second level waveguide. In this embodiment, the EML is monolithically integrated with EAM driver circuitry and laser driver circuitry. The latter comprises bias control for operation of the laser as a CW light source, and optionally comprises other elements, e.g. for temperature sensing, power monitoring, a control loop for temperature stabilization and power adjustment. Additional semiconductor layers for the laser driver circuitry and EAM driver circuitry are provided between the SI substrate and the waveguide layers as illustrated schematically. These layers comprise layers for forming high-speed electronic circuitry for the laser driver and EAM driver circuitry. For example, the additional layers comprise InP based semiconductor layers which are structured to fabricate heterojunction bipolar transistors (HBT), which are labelled as HBT epilayers for electronic circuitry, and a spacer, which comprises one or more layers and includes one or more etch stop layers, which allow for separate processing of the optical components and the electronic circuitry. The laser driver circuitry comprises bias control for operation of the laser as a CW light source, and optionally comprises other elements, e.g. for temperature sensing, power monitoring, a control loop for temperature stabilization and power adjustment.

As shown in FIG. 2, which is a schematic plan view 200 of the electro-photonic module comprising the EML shown in FIG. 1, the multilevel optical waveguide structure for the DFB laser, EAM and output waveguide of this embodiment are formed on a first area of the SI substrate, and the electronic circuitry is formed on an adjacent second area of the SI substrate, e.g. laterally spaced from the optical components.

For EML of some embodiments, the epitaxial layer structure is compatible with a single epitaxial growth process, fabricated using III-V semiconductor materials. For example, in some embodiments, the integrated EML is fabricated using an InP-based material system, comprising selected binary, ternary and quaternary and other compositions of In, Ga, As, P, Al and Sb. For example, the SI substrate may be iron-doped InP. Optionally, fabrication may use multiple epitaxial growths.

The general principles of selecting materials and structuring the waveguide layers for vertical optical coupling using laterally tapered vertical optical couplers, i.e. appropriate selection of bandgap wavelength and refractive index, is described in, e.g. U.S. Pat. No. 7,444,055B2 to Tolstikhin, entitled "Integrated Optics Arrangements for Wavelength (de) Multiplexing in a Multi-Guide Vertical Stack", and references cited therein.

Fabrication of an electro-photonic circuit module comprising an EML and monolithically integrated EAM driver circuitry and laser driver circuitry, using an InP based material systems and vertical integration, provides for miniaturization and a compact design with a small form factor, e.g. an EML module that is ~1 mm long and less than a mm wide.

Beneficially, the integrated EAM driver and control circuitry comprises a high-speed electro-optical control loop for very high-speed linearization and temperature compensation, e.g. to enable advanced modulation schemes, such as PAM-4 and DP-QPSK, for analog optical data center interconnect applications.

FIG. 3 shows a schematic block diagram of an electro-photonic module comprising an EML of example embodiments configured for bidirectional operation in a transmitter mode 20) and in a receiver mode. The electro-photonic module comprises a laser and an electro-absorption (EAM) modulator, and integrated electronic control circuitry comprising a laser driver, an EAM driver and a transimpedance amplifier (TIA). The laser and the EAM forming the EML are optically coupled, e.g. using laterally tapered vertically optical couplers, or a lateral waveguide optical coupler or butt-coupling. The EAM comprises a first part M1 and a second part M2 and electrical connections from the EAM driver to the first part and the second part of the EAM so that the first and second parts of the EAM can be independently biased. The control circuitry is configured to bias said electrical connections to operate the first and second parts of the EAM independently in a transmitter mode and in a receiver mode. In the transmitter mode, the laser and first and second parts of the EAM are operable as an EML to provide a modulated optical output; and in the receiver mode, the second part of the EAM is operable as photodiode receiver to receive an optical input and output a photocurrent to the TIA. This configuration saves the die area and power associated with having a separate photo-detector comprising a pin-TIA. The control circuitry has a connection for a bi-directional data bus, and comprises a mode select input for receiving a transmit/receive enable signal to switch between the transmitter mode and receiver mode.

For example, FIG. 4 shows a diagram to illustrate bi-directional operation of the electro-photonic module of FIG. 3 in a transmitter mode and in a receiver mode. In the transmitter mode, the laser is on, to provide a cw output which is optically coupled to the modulator, and the EAM driver drives both parts M1 and M2 of the modulator to provide a modulated optical output. That is, the device functions as an EML. In the receiver mode, the laser is turned nearly off: the laser driver reduces the laser drive current down to close to the threshold current to reduce the light output; the EAM driver drives the first part of the modulator M1 to absorb residual laser light and operates the second part of the modulator M2 as a photo-diode receiver to receive optical input and provide photocurrent input to the TIA.

Figure 5:
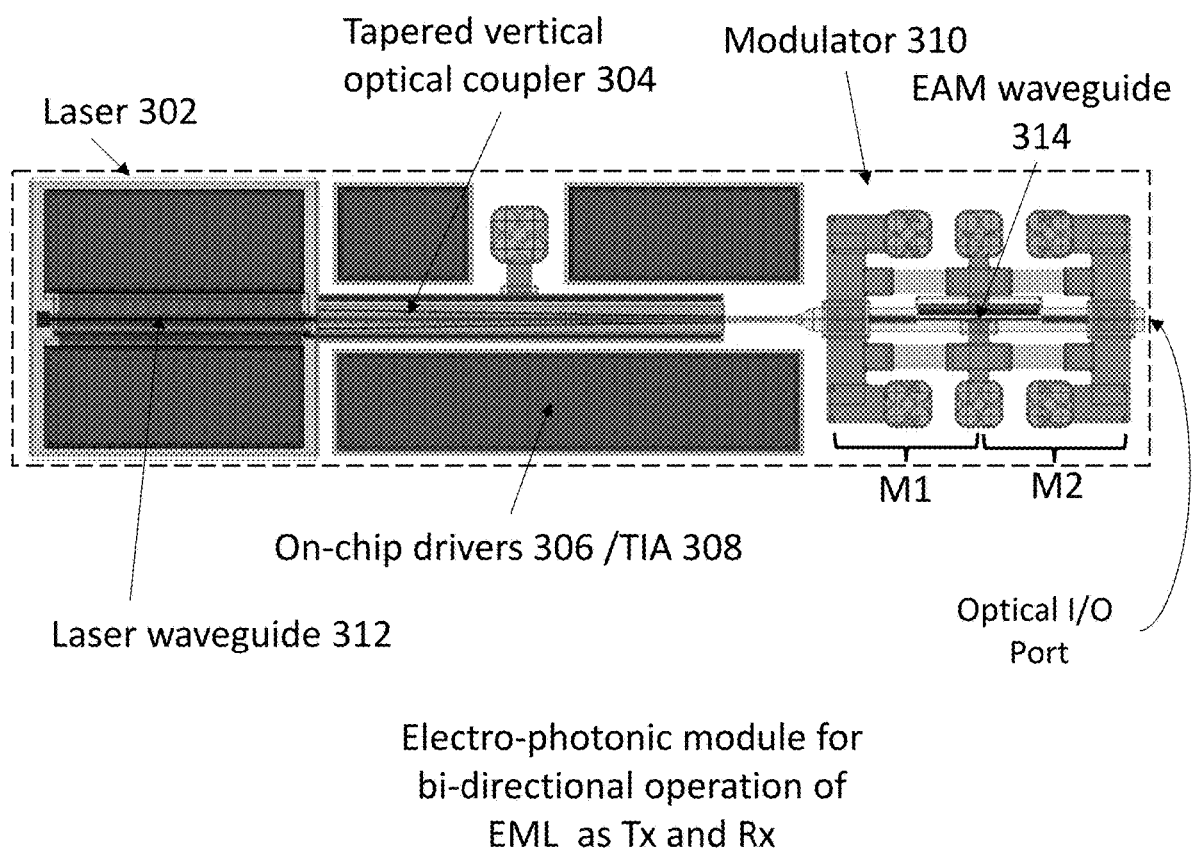
FIG. 5 shows a schematic top plan view of an electro-photonic module comprising an EML of a first embodiment configured for bidirectional operation as a transmitter and a receiver.

For example, to provide a compact design, the electro-photonic module with monolithically integrated electronics may be fabricated using an InP based semiconductor materials system, with vertical integration, using laterally tapered vertical optical couplers for optical coupling of the laser waveguide and EAM waveguide. FIG. 5 shows a schematic top plan view 300 of an electro-photonic module comprising an integrated EML of a first embodiment configured for bidirectional operation as a transmitter and a receiver. The integrated bidirectional EML comprises a laser 302 and an EAM modulator 310 which are vertically integrated using a laterally tapered vertical coupler 304. In this embodiment, the integrated driver circuitry 306 provides for driving the EML in a transmit mode and in a receive mode. The driver circuitry 306 comprises on-chip laser driver circuitry, driver circuitry for the EAM modulator, and also includes transimpedance amplifier (TIA) 308.

Figure 6:
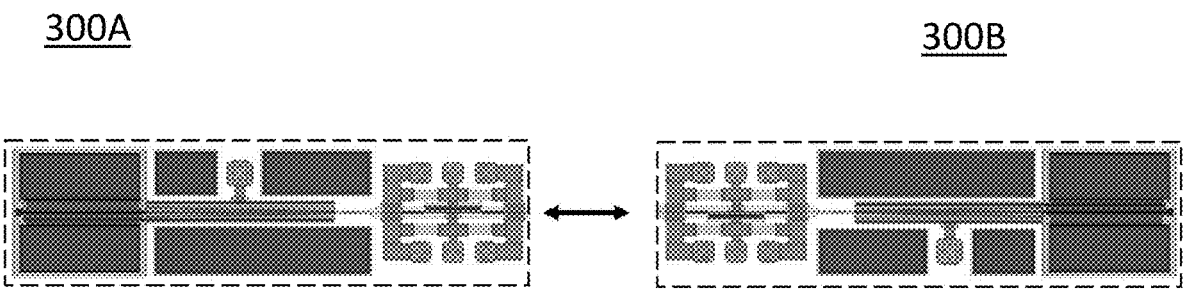
FIG. 6 shows a schematic top plan view of first and second electro-photonic modules comprising EMLs of the first embodiment configured for bidirectional operation as a transmitter and a receiver.

FIG. 6 shows a schematic top plan view 400 of first and second EMLs 300A and 300B, as shown in FIG. 5, configured for bidirectional operation as a transmitter and a receiver wherein one EML is configured as a transmitter and the other EML is configured as a receiver. When one of the EMLs is configured in transmit mode, it operates as an EML as normal, with the laser turned on using the laser driver circuit to provide an appropriate laser drive current, and the EAM driver circuit operates the modulator. When one of the EMLs is configured in receive mode, the EML operates as a receiver by turning "off" the laser, e.g. by reducing the laser drive current to a threshold current Ith plus a small value e.g. +20 mA, and one half of the EAM is biased to absorb the remaining light, and the other half of the EAM operates to see only the light coming from the other end, which is detected by the TIA circuit. Thus in receive mode, the modulator and the TIA becomes the receiver. This configuration saves the die area and power associated with having a separate detector comprising a pin-TIA. During the receive mode operation, if the laser drive current is reduced below the threshold current, to entirely turn off the laser, this would introduce undue delay in turning-on the laser for transmit mode. It is therefore desirable to maintain a low drive current close to, slightly above the threshold current (Ith), e.g. enough above Ith to preserve fast switching, and use part of the EAM waveguide to absorb the remaining laser light during operation in receive mode.

In an example embodiment, the EML is fabricated to be 1.2 mm long and 0.6 mm wide, per channel. This is significantly shorter, e.g. 15 to 20 time shorter in length, than TFLN modulators, and also significantly shorter than any demonstrated micro-ring resonator solution. As an example, in some embodiments of an EML, the laser, EAM and driver circuitry can be integrated for an input of 250 mV in from 50Ω, and for a pin-TIA output of 50 mV into 50Ω, at 100 GB (e.g. 106 Gb/s NRZ or 212 Gb/s PAM4)

A monolithically integrated laser and EAM can be tuned without heat. For a DFB laser, e.g. having a wavelength temperature sensitivity of 0.09 nm/C and a QCSE EAM with 0.46 nm/C, the bias Vb on the EAM can be varied using a temperature sensor based on the bandgap, to control Vb for temperature compensation, e.g. as disclosed in U.S. Pat. No. 10,673,532, issued Jun. 2, 2020, entitled "Electro-absorption modulator with integrated control loop for linearization and temperature control".

Figure 7:
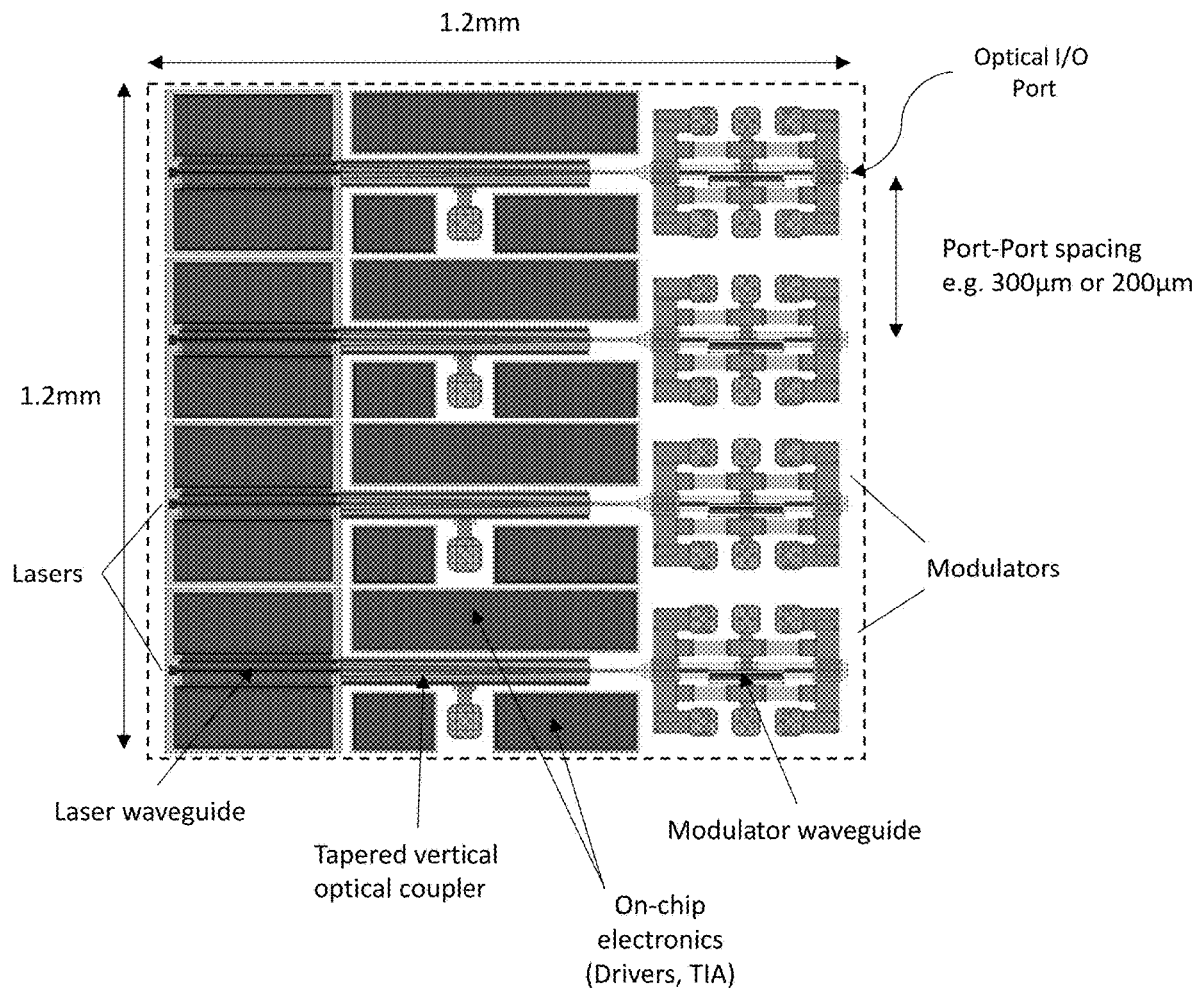
FIG. 7 shows a schematic top plan view of a four port electro-photonic module of a second example embodiment comprising four integrated EMLs configured for bidirectional operation as transmitters and receivers.

FIG. 7 shows a schematic top plan view 500 of a four-port electro-photonic integrated circuit of a third example embodiment comprising four integrated EMLs configured for bidirectional operation as transmitters and receivers. Some dimensions are shown by way of example only. For example, the four-port integrated EML may be integrated on a substrate having a length of 1.2 mm and a width of 1.2 mm, to provide an optical port-to-port spacing of 300 μm. Based on current technology, the port-to-port spacing could feasibly be reduced to 250 μm, or 200 μm, to provide a compact form factor. For example, a transmit bandwidth of >120 GHz allows for 1 Tb PAM-4 on 4 lanes, and an efficiency of 1.1 pJ/bit. Using a single laser for 4 lanes would improve the efficiency to 0.5 pJ/bit.

Figure 8:
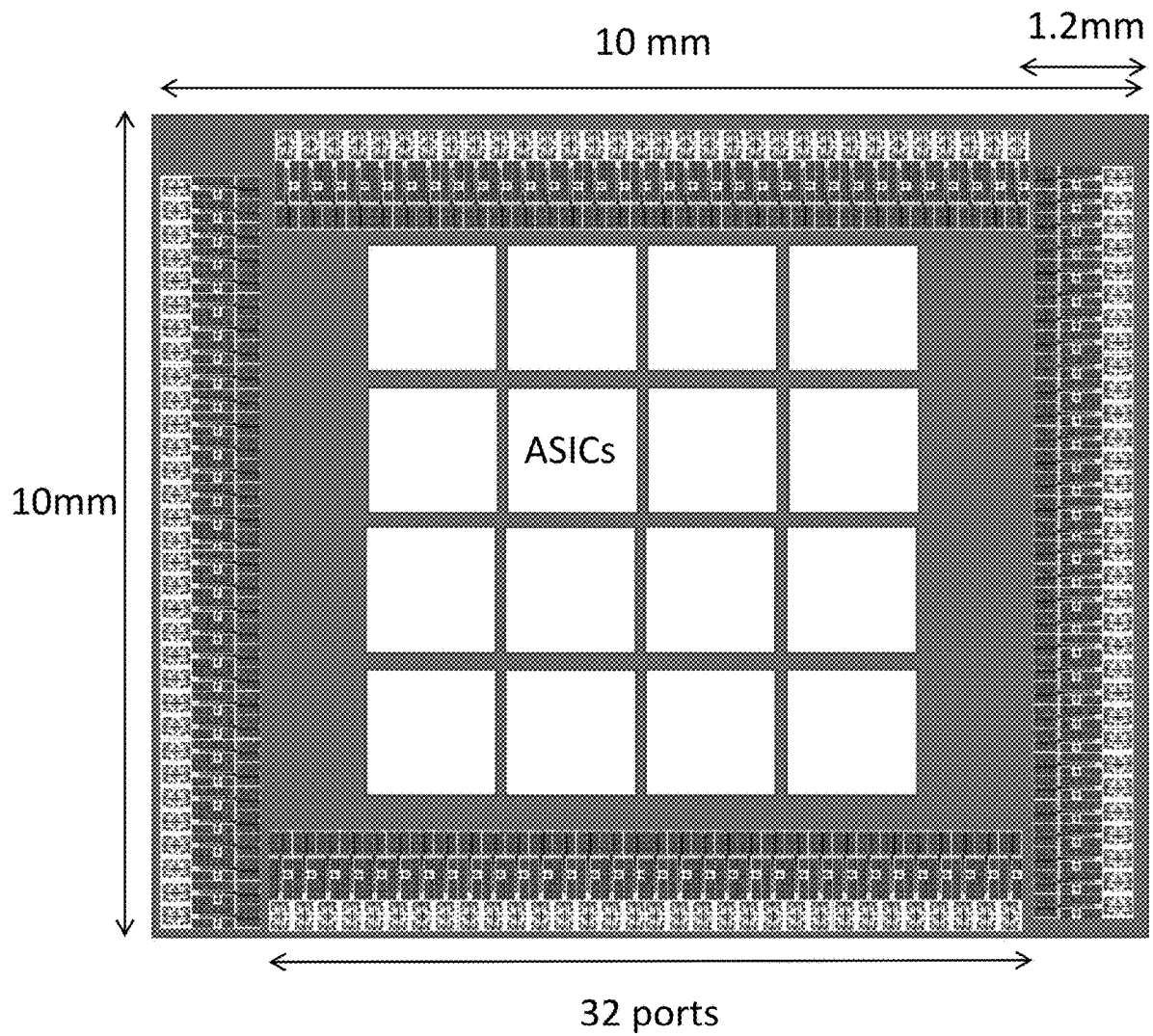
FIG. 8 shows a schematic top plan view of a substrate of a co-packaged optical module comprising an arrangement of 128 optical ports provided by InP electro-photonic chiplets of an example embodiment and a plurality of switch ASICs, to illustrate an example use case.

FIG. 8 shows a schematic top plan view 600 of a substrate of a co-packaged optical module of a fourth example embodiment, comprising an arrangement of 128 optical ports provided by InP electro-photonic chiplets and a plurality of switch core ASICs, to illustrate an example use case. In this example, 128 optical ports are provided around the periphery of a 10 mm×10 mm substrate, with a port density of 32 ports per side; e.g. 300 µm port spacing along 9.6 mm each side, and for 250 µm port spacing, along 8 mm each side. In this example, the total I/O area is 38 mm$^2$, leaving a large central area for the ASIC switch cores to be co-packaged on the substrate. The proposed small form factor matches 125 µm diameter optical fibers. The integrated bidirectional EML electro-photonic modules can be provided as chiplets for co-packaging with silicon chiplets, e.g. switch core ASICs.

Figure 9:
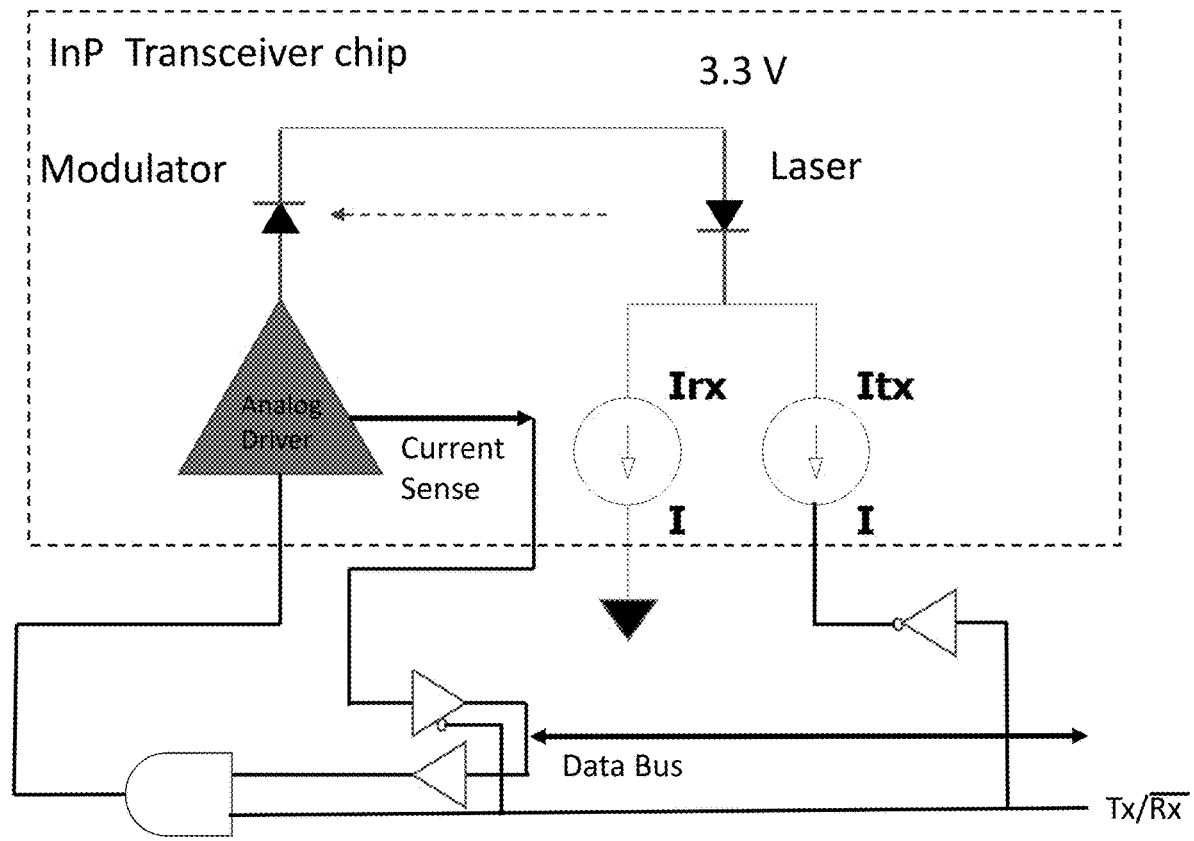
FIG. 9 shows a simplified circuit schematic to illustrate driving logic for bidirectional operation of the integrated EML of the first embodiment in transmitter mode and receiver mode.

FIG. 9 shows a simplified circuit schematic 700 to illustrate conceptually an example of driving logic for bidirectional operation of the integrated EML of the first embodiment in transmitter and receiver modes. When the EML is operated in transmit mode, it operates as an EML as normal, with the laser turned "on" using the laser driver circuit to provide the appropriate laser drive current, and the EAM driver circuit operates the modulator. When the EML is operated in receive mode, the EAM is operated as a receiver by turning "off" the laser, e.g. by reducing the laser drive current to close to a threshold current Ith, e.g. Ith+~20 mA, and one half of the EAM is biased to absorb the remaining light, and the other half of the EAM operates to see only the light coming from the other end, which is detected by the TIA circuit. The control circuitry is connected to a bidirectional data bus and comprises a mode select input for receiving a transmit/receive enable signal for switching between the transmitter mode and receiver mode.

Figures 15A, 15B:
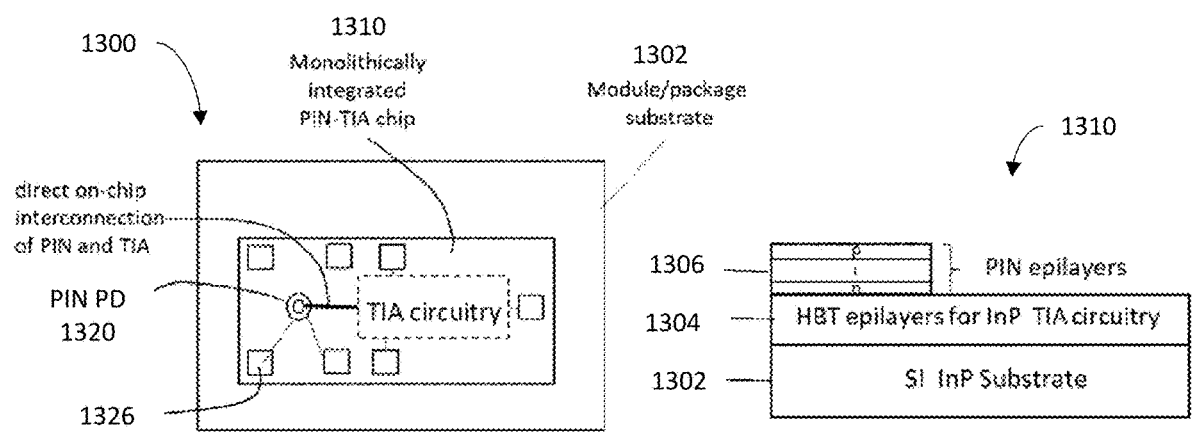
FIG. 15A and FIG. 15B show, respectively a schematic plan view and a schematic cross-sectional view of an example monolithically integrated pin-TIA.

Partitioning of the EAM into a first part that acts as a controlling EAM and a second part that acts as a modulating EAM, allows for bidirectional operation of the EAM in a transmit mode and in a receive mode. This configuration saves the die area and power associated with having a separate chip for a detector comprising a pin-TIA, e.g. as described in the above referenced patent publication US20230019783 A1 "Optical Receiver comprising monolithically integrated photodiode and transimpedance amplifier", e.g. as illustrated schematically in FIG. 15A and FIG. 15B. FIG. 15A shows a schematic plan view 1300 of a monolithically integrated pin-TIA chip 1310, comprising PIN PD 1320 and TIA circuitry which have a direct on chip connection, and contact areas 1326. FIG. 15B shows a schematic cross-sectional view 1310 of the PIN PD comprising a substrate 1302, HBT epilayers 1304 for the TIA circuitry, and PIN epilayers 1306 for the PIN PD.

Figure 10:
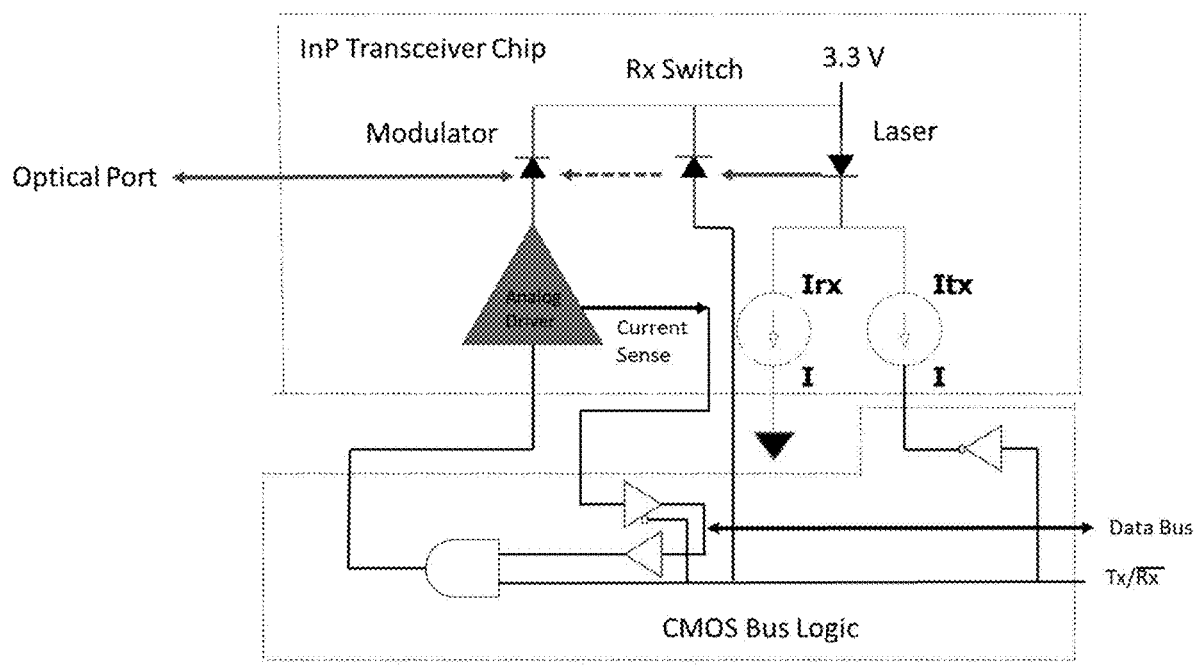
FIG. 10 shows a simplified circuit schematic to illustrate more details of the driving logic for bidirectional operation of the integrated EML of the first embodiment in transmitter and receiver modes.

FIG. 10 shows a simplified circuit schematic 800 to illustrate more details of the driving logic for bidirectional operation of the integrated EML of the first embodiment in transmitter and receiver mode, to illustrate components of the InP transceiver chip and CMOS bus logic to switch between transmit and receive modes of the integrated EML. The control circuit comprises an Rx switch that is connected to a mode select input for receiving a transmit/receive enable signal to switch between the transmitter mode and receiver mode.

Figure 11:
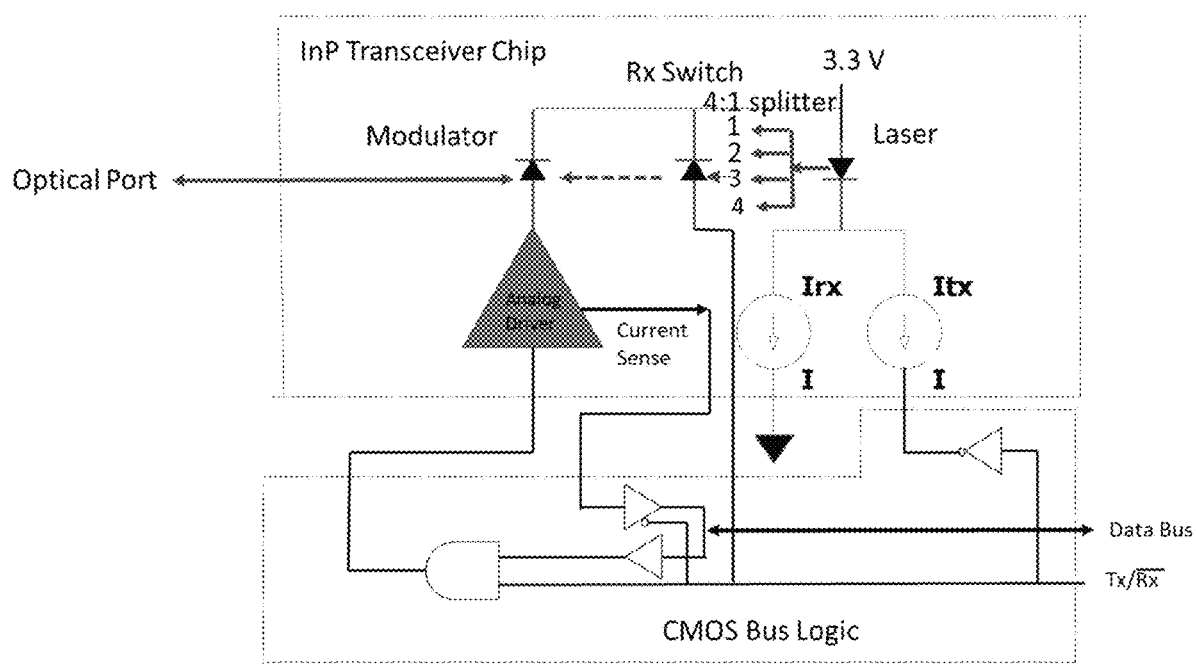
FIG. 11 shows a simplified circuit schematic to illustrate driving logic for bidirectional operation of an integrated EML of the second embodiment in transmitter and receiver modes, with four channels per laser.

FIG. 11 shows a simplified circuit schematic 900 to illustrate more details of the driving logic for bidirectional operation of an integrated EML of the third embodiment in transmitter and receiver modes, with four channels per laser, e.g. as illustrated schematically in FIG. 7. A single laser output is split into 4 channels by a 4:1 optical splitter, to provide optical input to 4 EML, each channel coupled to an individual EML, to further optimize performance, e.g. to reduce power to <0.5 pJ/bit.

Referring to FIG. 12, FIG. 13 and FIG. 14, and U.S. Pat. No. 11,092,762 B2 "Surface Mount Packaging for Single Mode Electro-Optical Module" issued Aug. 17, 2021 (which is incorporated herein by reference), this reference discloses examples of surface-mount packaging of electro-photonic modules in which connector technology is miniaturized to allow for vertically-coupled or edge-coupled optical fibers. As an example for surface-coupled optical fibers, FIG. 12 shows a substrate 1002, on which is mounted a surface-mount optical module 1004 having 4 optical ports 1006, and an optical connector 1010 carrying four optical fiber pigtails 1012. The optical connector is removably secured to the surface mount optical module 1004 by a latch arrangement, such as clip 1008. As an example for edge coupled optical fibers, FIG. 13 shows a substrate 1102 and a surface mount optical module 1104 having a plurality of lateral optical ports 1106; an optical connector carrying a plurality of optical fiber pigtails is inserted into the optical ports 1106, which is removably secured with latches. FIG. 14 shows a schematic cross-sectional view of one optical fiber 1200 carried by an optical connector 1110 inserted into an optical I/O port of a surface mount optical module comprising an electro-photonic chiplet 1202, for lateral coupling of the optical fiber to an optical I/O port. This I/O concept is scalable to a plurality of optical I/O ports, along one or more sides of the module, and allows for co-packaging of electro-photonic chips and electronic die on ceramic substrates designed for fully automated assembly, including optical alignment. Materials are selected to be robust enough to withstand soldering processes without damage.

In alternative embodiments, monolithically integrated electro-photonic modules (chiplets) comprising an EML and integrated control electronics for bi-directional operation in a transmitter mode and in a receiver mode may be fabricated using lateral optical coupling, instead of vertical optical coupling, of the laser and EAM waveguides. Structures comprising vertical optical coupling or lateral optical coupling may be fabricated with InP based semiconductor materials, or other semiconductor materials capable of monolithic integration of the optical components of EML and control electronics.

Monolithically integrated electro-photonic modules (chiplets) comprising transceivers of some example embodiments disclosed herein, fabricated with InP based semiconductor materials, and vertical optical integration using laterally tapered vertical optical couplers, provide for a compact design with a small form factor, and provide higher speeds, lower power (e.g. <0.5 pJ/bit), higher reliability, and lower cost, compared with some existing solutions. The electro-photonic chiplets can be co-packed with other electronics, e.g. silicon chiplets comprising switch cores. The small form factor can match 125 µm micron fiber diameters. As an example, an electro-photonic module on a substrate having a 10 mm×10 mm edge, with 128 optical ports can provide high optical performance, e.g. 30 Tb/s, leaving an area of 8 mm×8 mm for processor cores in the central area.

Although example embodiments have been described and illustrated in detail, it is to be clearly understood that the same is by way of illustration and example only and not to be taken by way of limitation, the scope of the present invention being limited only by the appended claims

The invention claimed is:

1. An electro-photonic integrated circuit comprising an electro-absorption modulated laser (EML),
  the EML comprising a laser and an electro-absorption modulator (EAM), and control circuitry comprising a laser driver circuit, an EAM driver circuit, and a transimpedance amplifier (TIA), wherein the EAM comprises a first part and a second part, and electrical connections to the first part and the second part of the EAM, and wherein the control circuitry is operable to bias said electrical connections to operate the first part and second part of the EAM independently in a transmitter mode and in a receiver mode, in the transmitter mode, the laser and first and second parts of the EAM are operable as an EML to provide a modulated optical output; and in the receiver mode, the second part of the EAM is operable as a photodiode receiver to receive an optical input and output a photocurrent to the TIA.

2. The electro-photonic integrated circuit of claim 1, wherein in the transmitter mode, the laser is turned on using the laser driver circuit to provide an appropriate laser drive current, and the EAM driver circuit operates the EAM to provide the modulated optical output; and in the receiver mode, the laser drive current is reduced to close to a threshold current, the first part of the EAM is biased to absorb residual light from the laser, and the second part of the EAM acts as a photodiode receiver for the optical input.

3. The electro-photonic integrated circuit of claim 1, having a vertically integrated structure wherein a waveguide of the laser and a waveguide of the EAM are vertically coupled by a laterally tapered vertical coupler.

4. The electro-photonic integrated circuit of claim 1, fabricated with an InP based semiconductor material system.

5. An electro-photonic integrated circuit comprising:
a semi-insulating (SI) substrate;
an epitaxial layer structure comprising a plurality of semiconductor layers grown on the SI substrate;
the epitaxial layer structure defining:
a first plurality of semiconductor layers comprising control circuitry; and a second plurality of semiconductor layers providing a plurality of vertically stacked optical waveguides, wherein:
a first waveguide comprises layers structured as an electro-absorption modulator (EAM) waveguide;
a second waveguide comprises layers structured as a laser waveguide;
said layers of the second waveguide are patterned to define a laser mesa providing a laser cavity and a laterally tapered vertical optical coupler extending from an optical output of the laser cavity;
said layers of the first waveguide are patterned to define a mesa of the EAM;
wherein the laser cavity is laterally spaced from the EAM along a direction of optical propagation, and the laterally tapered vertical optical coupler is structured to couple an emitted optical mode from the laser cavity to an input of the EAM; and
the control circuitry comprises a laser driver circuit, an EAM driver circuit, and a transimpedance amplifier (TIA);
first electrical connections between the laser driver circuit and the laser for operating the laser in CW mode;
second electrical connections between the EAM driver circuit and the EAM for driving the EAM,
wherein the EAM comprises a first part and a second part which can be independently biased;
the control circuitry providing for bidirectional operation wherein:
in a transmitter mode, the laser and the first and second parts of EAM are operable as an EML to provide a modulated optical output; and in a receiver mode, the second part of the EAM acts as a photodiode receiver to receive an optical input and output a photocurrent to the TIA.

6. The electro-photonic integrated circuit of claim 5, wherein:
in the transmitter mode, the laser is turned on using the laser driver circuit to provide a cw laser output, and the EAM driver circuit operates the EAM to provide the modulated optical output; and
in the receiver mode, the laser drive current is reduced to close to a threshold current, the first part of the EAM is biased to absorb residual light from the laser, and the second part of the EAM acts as a photodiode receiver for the optical input.

7. The electro-photonic integrated circuit of claim 5, wherein the SI substrate is Fe-doped InP and the EML is fabricated from an InP-based material system, comprising selected binary, ternary and quaternary and other compositions of In, Ga, As, P, Al, and Sb.

8. The electro-photonic integrated circuit of claim 5, wherein the control circuitry comprises a switch for switching between the transmitter mode and the receiver mode, the switch having an input for receiving a transmit enable or receive enable signal from a data bus logic circuit.

9. The electro-photonic integrated circuit of claim 5, wherein the control circuitry comprises a connection for a bidirectional data bus, and comprises a mode select input for receiving a transmit/receive enable signal to switch between the transmitter mode and the receiver mode.

10. The electro-photonic integrated circuit of claim 5, comprising a plurality of EAMs, wherein the laser is coupled to the plurality of EAMs through a 1:N optical splitter.

11. The electro-photonic integrated circuit of claim 5, comprising four EAMs, wherein the laser is coupled to the four EAMs through a 1:4 optical splitter.

12. The electro-photonic integrated circuit of claim 5, further comprising a passive waveguide vertically disposed under the EAM waveguide and patterned to form a spot size converter (SSC); the EAM waveguide comprising a second laterally tapered vertical optical coupler structured to couple the optical output/input from/to the SSC for coupling to a single mode optical fiber.

13. The electro-photonic integrated circuit of claim 5, wherein, the first plurality of semiconductor layers for the control circuitry are vertically separated from the plurality of vertically stacked optical waveguides by at least one spacer layer.

14. The electro-photonic integrated circuit of claim 5, wherein optical components comprising the laser and the EAM are formed on a first area of the SI substrate; and the control circuitry is formed on a second area of the SI substrate, adjacent the first area.

15. The electro-photonic integrated circuit of claim 5, wherein the epitaxial layer structure is compatible with a single epitaxial growth process.

16. The electro-photonic integrated circuit of claim 5, fabricated with III-V semiconductor materials.

17. The electro-photonic integrated circuit of claim 5, fabricated with an InP based material system, comprising selected binary, ternary and quaternary and other compositions of In, Ga, As, P, Al, and Sb.

18. A surface mount electro-photonic module comprising: a substrate, a plurality of electro-photonic integrated circuits as defined in claim 5, the plurality of electro-photonic integrated circuits being arranged on a peripheral area of the substrate to provide optical I/O ports along at least one edge of the substrate; and a plurality of electronic integrated circuits mounted on another area of the substrate, and electrical connections between the plurality of electro-photonic integrated circuits and the plurality of electronic integrated circuits.

19. The surface mount electro-photonic module of claim 18 wherein the plurality of electro-photonic integrated circuits are arranged around a peripheral area of the substrate to provide the optical I/O ports along each edge of the substrate; and the plurality of electronic integrated circuits are mounted within an inside area of the substrate.

20. The surface mount electro-photonic module of claim 18, wherein the plurality of electronic integrated circuits are silicon integrated circuits.

21. The surface mount electro-photonic module of claim 18, configured for edge coupling of optical fibers to the optical I/O ports of each electro-photonic integrated circuit.

22. The surface mount electro-photonic module of claim 18, wherein an optical port-to-port spacing is in a range of 200 μm to 300 μm.

23. The surface mount electro-photonic module of claim 19, comprising 128 ports distributed around a periphery of the substrate.

* * * * *